United States Patent [19]

Streit et al.

[11] Patent Number: 5,448,087
[45] Date of Patent: Sep. 5, 1995

[54] HETEROJUNCTION BIPOLAR TRANSISTOR WITH GRADED BASE DOPING

[75] Inventors: Swight C. Streit, Long Beach; Aaron K. Oki, Torrance, both of Calif.

[73] Assignee: TRW Inc., Redondo Beach, Calif.

[21] Appl. No.: 876,199

[22] Filed: Apr. 30, 1992

[51] Int. Cl.$^6$ .................. H01L 29/161; H01L 29/205; H01L 29/225
[52] U.S. Cl. .................... 257/198; 257/592; 257/26
[58] Field of Search .................. 257/198, 592, 26

[56] References Cited

U.S. PATENT DOCUMENTS

| 4,254,429 | 3/1981 | Yomazaki | 257/198 |
|---|---|---|---|
| 4,593,305 | 6/1986 | Kurata et al. | 257/198 |
| 4,712,121 | 12/1957 | Yokoyama | 257/26 |
| 4,794,440 | 12/1988 | Capasso et al. | 257/198 |
| 4,825,265 | 4/1989 | Lunardi et al. | 257/592 |
| 4,839,303 | 6/1989 | Tully et al. | 257/198 |
| 4,996,166 | 2/1991 | Oshima | 257/592 |

OTHER PUBLICATIONS

Streit et al, 'Effect on Exponentially Graded Base ...' *IEEE Electron Device Letters*, vol. 12 H5, May 1991, pp. 194–196.

Liem Tran, et al.; "In AlAs/InGaAs HBT with Exponentially Graded Base Doping and Graded in GaALAs Emitter-Base Junction"; Fourth International Conference on Indium Phosphide and Related Materials; Cat. No. 92CH3104-7 pp. 438–441 (Apr. 1992).

Streit, D. C.; "High Performance HBT's with Built-in Base Fields Exponentially-Graded Doping vs. Graded Composition" In Proceeding IEEE/Cornell Conference on Advanced Concepts in High Speed Semiconductor Devices and Circuits; Cat. No. 91CH3092-4; pp. 325–333 (Aug. 1991).

*Primary Examiner*—Sara W. Crane
*Assistant Examiner*—Stephen D. Meier

[57] ABSTRACT

A heterojunction bipolar transistor with an exponentially graded base doping is disclosed, in addition to a technique for fabricating the transistor. In accordance with the preferred embodiment, the transistor employs a base with an exponentially graded Beryllium doping which varies from $5 \times 10^{19}$ cm$^{-3}$ at the base-emitter junction to $5 \times 10^{18}$ cm$^{-3}$ at the base-collector junction. The built-in field due to the exponentially graded doping profile significantly reduces base transit time despite bandgap narrowing associated with high base doping. Compared to devices with the same base thickness and uniform base doping, the cut off frequency is increased and the maximum frequency of oscillation is also increased. Also, consistently higher common emitter current gain results even though the Gummel number is twice as high and the base resistance is reduced by 40%.

5 Claims, 4 Drawing Sheets

MBE EPITAXIAL STRUCTURE USED FOR HBT FABRICATION / 10

| LAYER | THICKNESS (μm) | DOPING (cm$^{-3}$) | AL COMPOSITION |
|---|---|---|---|
| 22 → CAP | 0.075 | $7 \times 10^{18}$ | 0 |
| 20 ↘ EMITTER 18 ↗ | 0.03<br>0.12<br>0.03 | $5 \times 10^{17}$<br>$5 \times 10^{17}$<br>$5 \times 10^{17}$ | 0.3 → 0<br>0.3<br>0 → 0.3 |
| 16 → BASE | 0.14 | $5 \times 10^{19} \to 5 \times 10^{18}$ | 0 |
| 14 → COLLECTOR | 0.7/1.0 | $7 \times 10^{15}$ | 0 |
| 12 → SUBCOLL | 0.6 | $5 \times 10^{18}$ | 0 |
| → SUBSTRATE | | | |

Fig-1

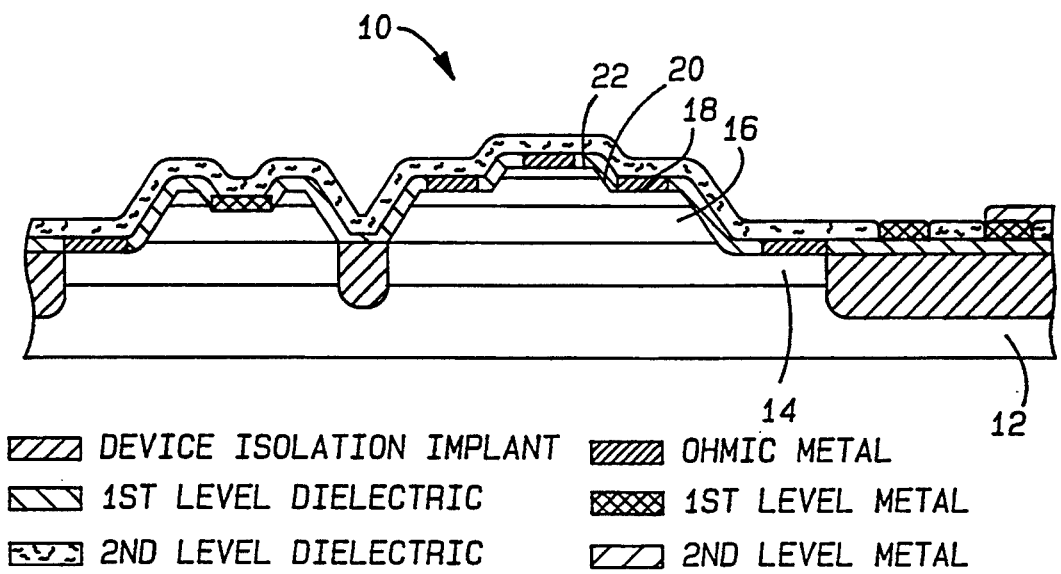

- ▨ DEVICE ISOLATION IMPLANT
- ◨ 1ST LEVEL DIELECTRIC
- ▧ 2ND LEVEL DIELECTRIC
- ▨ OHMIC METAL
- ▩ 1ST LEVEL METAL
- ▨ 2ND LEVEL METAL

Fig-2

COMPARISON OF HBT'S WITH BASE DOPING UNIFORM OR EXPONETIALLY GRADED

| SAMPLE | BASE DOPING | COLLECTOR (μm) | $BV_{CBO}$ (V) | BETA | $f_T$ (GHz) | $f_{MAX}$ (GHz) | $R_B$ (Ω) |
|---|---|---|---|---|---|---|---|
| A | UNIFORM | 0.7 | 22.5 | 60 | 23 | 36 | 48 |
| B | EXP. GRADED | 0.7 | 23.0 | 70 | 31 | 52 | 30 |
| C | UNIFORM | 1.0 | 28.0 | 65 | 22 | 40 | 50 |
| D | EXP. GRADED | 1.0 | 29.5 | 135 | 31 | 58 | 30 |

COMPARISON OF GRADED BASE PROFILES: EFFECT ON HBT PERFORMANCE

| 1400Å BASE PROFILE | $f_T$ (GHz) | $t_B$ (pS) | $f_{MAX}$ (GHz) | B |
|---|---|---|---|---|
| UNIFORM BASE DOPING | 22.6 | 2.20 | 41.1 | 90 |
| EXP. GRADED DOPING | 27.8 | 0.88 | 54.6 | 113 |
| GRADED $Al_xGa_{1-x}As$ | 29.0 | 0.65 | 43.0 | 120 |

EMITTER = $2 \times 10 \mu m^2$, 1 = 4mA ($2 \times 10^4 A/cm^2$)

HETEROJUNCTION BIPOLAR TRANSISTOR WITH GRADED BASE DOPING

CROSS-REFERENCE TO RELATED APPLICATION

The present invention contains subject matter which is related to commonly assigned co-pending U.S. Patent Application entitled, "Method of Producing High Reliability Heterojunction Bipolar Transistors", U.S. Ser. No. 07/752,401, which is hereby incorporated by reference.

BACKGROUND OF THE INVENTION

1. Technical Field

This invention relates to heterojunction bipolar transistors, and more particularly to heterojunction bipolar transistors having graded base doping.

2. Discussion

Heterojunction bipolar transistors (HBTs) are utilized in many important applications such as log amps for avionics, analog to digital convertors, sample and hold circuits, fast processors for high-speed computation, and many other areas. The relatively high cut off frequency of HBTs make them useful, generally, in high-frequency applications such as those at microwave frequencies.

Much work has been done in further improving the performance of heterojunction bipolar transistors, particularly GaAs/AlGaAs heterojunction bipolar transistors. One area of research is to provide a built-in field in the base of such transistors. It is well known that such a built-in drift field in the base adds a drift component to aid minority-carrier transit across the base resulting in reduced base transit time and higher cut off frequency. A built in field in these transistors can also lead to improved common-emitter current gain $\beta$ due to a reduction in surface and bulk recombination. This drift field can be produced by grading the dopant concentration across the base. In a non-graded base, minority transport is all diffusive. Early silicon bipolar drift transistors achieved this built in field from graded doping which resulted naturally from the diffusion process used to introduce the dopant into the base region. However, this technique has not been applied to npn heterojunction bipolar transistors because, 1) it is difficult to control the epitaxial growth process with sufficient precision to grade the base doping (particularly at high doping levels), and 2) the prevalent assumption that band-gap narrowing associated with high base doping would render the field produced by the graded doping useless.

Currently, quasi-electric fields in the base of HBTs are usually produced by grading the AlGaAs or In-GaAs alloy composition (as opposed to the doping) so that the band-gap is reduced across the base from the emitter to the collector. See H. Kroemer, "Heterostructure Bipolar Transistors: What Should We Build?," J. Vac. Sci. Technol., Vol. B1, pp. 126–130, 1983; and P. M. Enquist, et al, "Heterojunction Bipolar Transistor Using Pseudomorphic GaInAs for the Base," Appl. Phys. Lett., Vol. 49, pp. 179–180, 1986.

Non-uniform base doping has been used to generate a built-in field in HBTs, but the doping gradient was not specified. See S. N. Mohammad, et al, "Suppression of the Emitter Size Effect on the Current-Voltage Characteristics of AlGaAs/GaAs Heterojunction Transistors," Appl. Phys. Lett., Vol 56, pp. 937–939, 1990. In brief, a definite performance improvement could be achieved in heterojunction bipolar transistors in a built-in base field could be developed using well controlled graded base doping.

Thus, it would be desirable to provide a heterojunction bipolar transistor with a built-in base field which would improve base transit time and raise the cut off frequency. Further, it would be desirable to provide a technique for accurately controlling a graded doping profile in a heterojunction bipolar transistor.

SUMMARY OF THE INVENTION

Pursuant to the present invention, heterojunction bipolar transistors having graded base doping are disclosed. In addition, a technique for fabricating graded base doping heterojunction bipolar transistors is also taught. The exponentially graded base doping results in a built-in field which results in a number of improvements in device performance such as increased cut off frequency and dc gain $\beta$.

In accordance with a first aspect of the present invention, a heterojunction bipolar transistor is comprised of a substrate, a collector layer formed on the substrate, and a base layer formed on the collector. The base layer contains a dopant with a graded concentration which varies according to a predetermined profile from a maximum value at the top of the base layer to a minimum value at the bottom of the base layer. Finally, an emitter layer is formed on top of the base layer.

In accordance with a second embodiment of the present invention, a method is provided for producing graded base doping in heterojunction bipolar transistors which includes the steps of providing an undoped GaAs substrate and heating the substrate to a temperature approximately between 580° to 620° C. Next, a silicon doped GaAs collector is grown on the substrate with a minimum As/Ga flux ratio sufficient to maintain an arsenic stabilized surface. A p-type GaAs base layer is then grown on the collector by simultaneously reducing the substrate temperature, raising the As/Ga flux ratio and increasing the p-type dopant concentration from start to finish of the base layer growth so as to produce a desired profile grading of the p dopant. The substrate temperature is then raised to approximately 600° C. or higher and an AlGaAs emitter layer is grown with the As/Ga flux ratio reduced to approximately the minimum level used for the collector growth.

BRIEF DESCRIPTION OF THE DRAWINGS

The various advantages of the present invention will become apparent to one skilled in the art by reading the following specification and by reference to the following drawings in which:

FIG. 1 is a representation of the cross-sectional profile structure of a heterojunction bipolar transistor with graded base doping in accordance with the present invention;

FIG. 2 is a schematic of a self-aligned base ohmic metal HBT structure in accordance with the present invention;

DESCRIPTION OF THE PREFERRED EMBODIMENTS

Figures 3, 4:
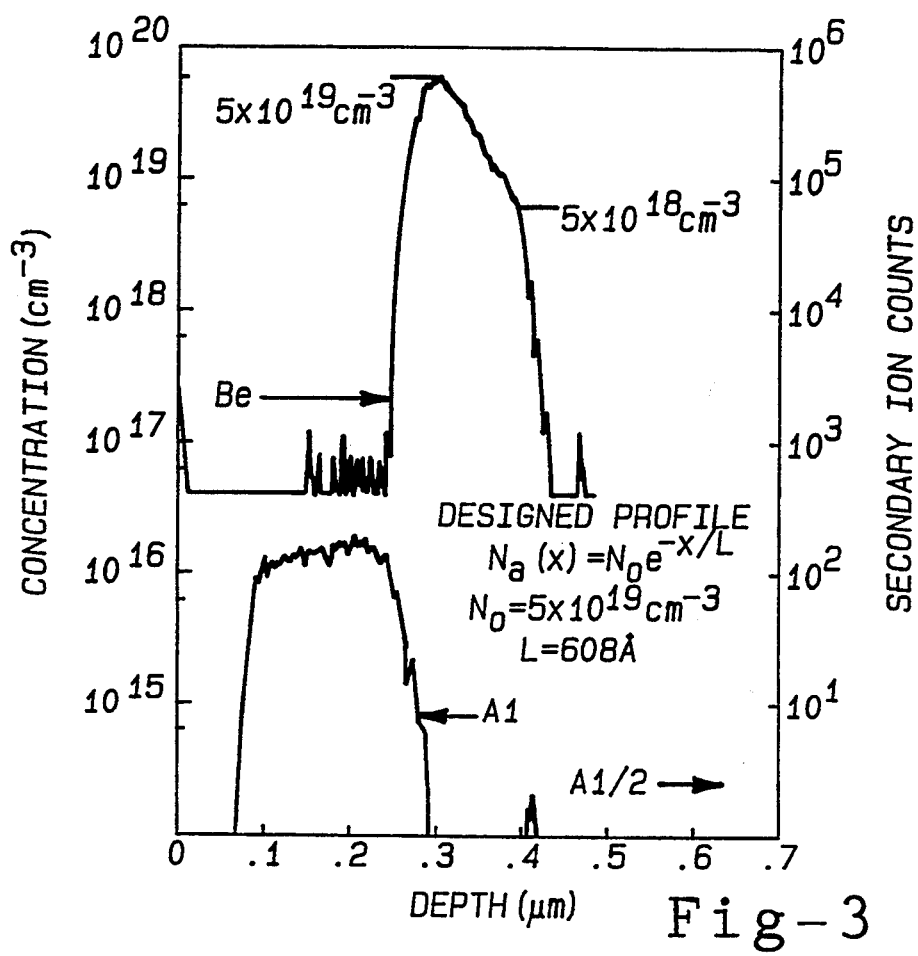
FIG. 3 is an SIMS profile of exponentially graded Be base doping in GaAs/AlGaAs heterojunction bipolar transistor in accordance with a preferred embodiment of the present invention.
FIG. 4 is a table comparing characteristics of heterojunction bipolar transistors with uniform base doping and with graded base doping in accordance with the present invention.

The present invention comprises techniques for producing a built-in field in the base of npn heterojunction bipolar transistors by grading the base doping from a high value at the base-emitter junction to a lower value at the base-collector junction. It will be appreciated that the built-in field is the sum of the field due to the graded doping and the field due to band-gap narrowing. Because of the effect of degeneracy, the field due to graded doping at high doping levels is considerably higher than that calculated from simpler classical formulas. The field due to band-gap narrowing opposes the field due to the graded doping profile, but because the magnitude of the field generated by the graded doping is considerably larger than that generated by band-gap narrowing effects, the benefits of the net built-in field can be observed. This can be shown in calculations of field versus position in the base based on Fermi-Dirac statistics. For example, the net built-in base field is sufficiently large that base transit time can be reduced from 2.2 pS for devices without the field to 0.8 pS for devices with the graded doping profile. This reduction in base transit time is significant, and results in an improvement in cut off frequency. The built-in field reduces bulk recombination in the base as a result of this shorter transit time, and therefore the dc current gain $\beta$ is improved. The high base doping at the emitter edge results in reduced contact resistance for the base ohmic metal, helping to reduce over-all base resistance, which is an additional advantage. The low base doping at the collector edge also improves breakdown.

Referring now to FIG. 1, there is shown a representation of a profile cross-sectional used for the heterojunction bipolar transistor in accordance with the present invention. The transistor 10 in accordance with a preferred embodiment was grown on an undoped GaAs substrate 12 using a solid-source Varian Modular Gen II molecular beam epitaxy (MBE) system with cracked arsenic. Growth parameters were optimized for each layer in accordance with well-known techniques such as those disclosed in D. L. Miller et al, "Be Redistribution During Growth of GaAs and AlGaAs by Molecular Beam Epitaxy," J. App. Phys., Vol. 57, pp. 1816-1822, 1985. Beryllium was used for small p-type and silicon was used for n-type doping.

A 0.6 $\mu$m thick subcollector 14 with a silicon doping concentration of $5 \times 10^{18}$cm$^{-3}$ was grown on the substrate. A collector 16 grown on top of the subcollector was either 0.7 or 1.0 $\mu$m thick and used a silicon doping of $7 \times 10^{15}$cm$^{-3}$. A 0.14 $\mu$m thick base layer 18 employed exponentially graded p-type Beryllium doping which was $5 \times 10^{19}$cm$^{-3}$ at the base collector junction and reduced to $5 \times 10^{18}$cm$^{-3}$ at the base collector junction. The emitter 20 is constructed in three distinct regions, the first beginning with zero percent aluminum composition graded up to 0.3 linearly to a thickness of 0.03 $\mu$m. The aluminum mole fraction is kept at 0.3 throughout the second region which has a thickness of 0.12 $\mu$m. The aluminum concentration is then decreased in a third region of the emitter linearly down to zero in the top region which is 0.03 $\mu$m thick. The purpose of the graded regions in the emitter 20 is to prevent a notch in the conduction band which would hurt device performance. A cap, or contact layer, 22 is then grown on the emitter layer with a thickness of 0.075 $\mu$m.

In accordance with a preferred embodiment of the present invention, the transistor 10 is produced utilizing an optimized molecular beam epitaxial growth process which permits sufficient control of the p-type base dopant to accomplish graded doping through the base. The basic technique without graded base doping is described in detail in the above-incorporated by reference patent application entitled, "Method of Producing High Reliability Heterojunction Bipolar Transistors," U.S. Ser. No. 07/752,401. In the technique of the present invention, Beryllium doping can be carefully controlled using reduced substrate temperature and increased arsenic flux.

In more detail, the GaAs subcollector 14, is first grown on the GaAs substrate 12 to the subcollector 14 insures good ohmic contact to the collector layer 16 which follows it. The subcollector is silicon doped with a concentration of $5 \times 10^{18}$cm$^{-3}$. The GaAs collector layer 16 is then grown on the subcollector with a silicon doping concentration of $7 \times 10^{15}$cm$^{-3}$. Both the subcollector 14 and collector 16 are grown at a conventional temperature of approximately 600° C. The collector 16 is grown with the minimum arsenic to gallium flux ratio required to maintain an arsenic stabilized surface. That is, at the minimum necessary for stoichiometric growth at this temperature. While the collector was grown at 600° C. in the preferred embodiment, an acceptable range would be between 580°-620° C. Once the collector is complete, the GaAs base layer growth begins. Initially, the temperature is kept at the same as for the collector growth, 600° C. The initial conditions are such that a Be dopant concentration of $5 \times 10^{18}$ cm$^{-3}$ is produced. That is, the dopant cell temperature and arsenic cell temperature are adapted to produce this desired Be concentration at a substrate temperature of 600° C.

In accordance with a preferred embodiment, every seven seconds throughout the total base growth time of 9 minutes (approximately 80 times), the conditions are adjusted to produce an increasing Be concentration. In particular, simultaneously the arsenic flux is increased (by increasing the arsenic cell temperature), the dopant flux is increased (by increasing the dopant cell temperature), and the substrate temperature is decreased. These three simultaneous changes occur ever seven seconds by amounts calculated to produce the desired dopant profile. The overall reduction in the substrate temperature throughout the base growth will be from 600° C. to about 530° C. A relatively smooth change in the Be concentration is achieved since the response time of the furnaces in response to temperature control adjustments is greater than seven seconds.

As a result, at the beginning of the base growth, the Beryllium concentration is approximately $5 \times 10^{18}$cm$^{-3}$. It is increased in an exponential fashion throughout the 0.14 μm thickness of the base until it reaches a concentration of $5 \times 10^{19} cm^{-3}$ at the emitter edge. The exponential doping profile in the base was obtained using a piece-wise linear approximation. The designed profile was $$N(x) = N_0 e^{-x/L}$$

where $N_0 = 5 \times 10^{19} cm^{-3}$, $L = 608$ Å, and X is defined as 0 at the base-emitter junction.

A secondary ion mass spectrometry (SIMS) profile of the Be concentration of this structure is shown in FIG. 3. FIG. 3 reveals that the doping levels and slope match well with the designed profile.

Once the base growth is complete, the AlGaAs emitter 20 is grown utilizing a silicon doping of $5 \times 10^{17} cm^{-3}$. It is important at this step that the arsenic pressure be reduced and the substrate temperature increased during the MBE deposition of the AlGaAs emitter. In particular, the temperature may be increased to over 600° C. or more; in the preferred embodiment, 620° C. is used. The arsenic gallium flux ratio is also reduced to a minimum level such as that used for the growth of the collector. The reduced arsenic pressure and increased substrate temperature during the MBE deposition of the emitter 20 results in a high-quality material for the depleted AlGaAs emitter region, which minimizes base/emitter space charge recombination and results in high reliability and high β.

The substrate temperature is reduced again for the growth at the top GaAs contact layer 22. In the preferred embodiment the contact layer 22 is grown at a reduced temperature which may be anywhere between 500°-600° C. This reduced temperature helps to achieve high n+ doping levels.

FIG. 2 shows a schematic of the self-aligned base ohmic metal HBT structure 10 of the present invention. The $2 \times 10$ μm devices were fabricated using a self-aligned base ohmic metal process. A mesa etch process was used to access the base and collector and AuBe/Ni and AuBe were evaporated for N- and p-type contacts, respectively. The devices were then isolated using ion-implanted boron. On-wafer S parameter measurements up to 26 GHz were used to characterize the devices; $f_T$ and $f_{max}$ were obtained by 6-DV/octave extrapolation.

FIG. 4 summarizes the results of graded versus uniform doping for four different wafers with two different collector designs. The values shown in FIG. 4 are averaged over about twenty sites on each wafer to give a representative sample size. The 1 μm collector thickness was designed to give higher breakdown than the baseline 0.7 μm thickness. The slight increase in $BV_{CBO}$ for the devices with exponentially graded doping is due to the reduction in base doping at the base-collector junction. To summarize, the graded devices have significantly higher $f_T$ and maximum frequency of oscillation $f_{max}$, and consistently higher common-emitter current gain β. For 1.0 μm collector thickness, $f_T$ increases from 22 to 31 GHz, $f_{max}$ from 40 to 58 GHz, and average β from 65 to 135 as measured on $2 \times 10$ μm devices at $2 \times 10^4 A/cm^2$. For further details of this comparative study, see D. C. Streit et al., "Effect of Exponentially Graded Base Doping on the Performance of GaAs/AlGaAs Heterojunction Bipolar Transistors", IEEE Electron Device Letters, Vol 12, No. 5, p. 194, 1991.

The increase in $f_T$ from 22-23 GHz for the uniformly doped samples to 31 GHz for the exponentially doped samples, indicates a significant reduction in base transit time. This is due to the built-in field in the base of the HBTs with exponentially graded doping. The increase in $f_{max}$ from 36 to 52 GHz for the 0.7 μm collector, and from 40 to 58 GHz for the 1.0 μm collector is due to both increased $f_T$ and reduced base resistance $R_b$ through $$f_{max} = (f_T/8\pi R_b C_{bc})^{\frac{1}{2}}.$$

Devices with the same base profile have a higher $f_{max}$ with 1 μm rather than 0.7 μm collectors due to smaller $C_{bc}$, partly caused by etch undercut.

Figures 5, 6:
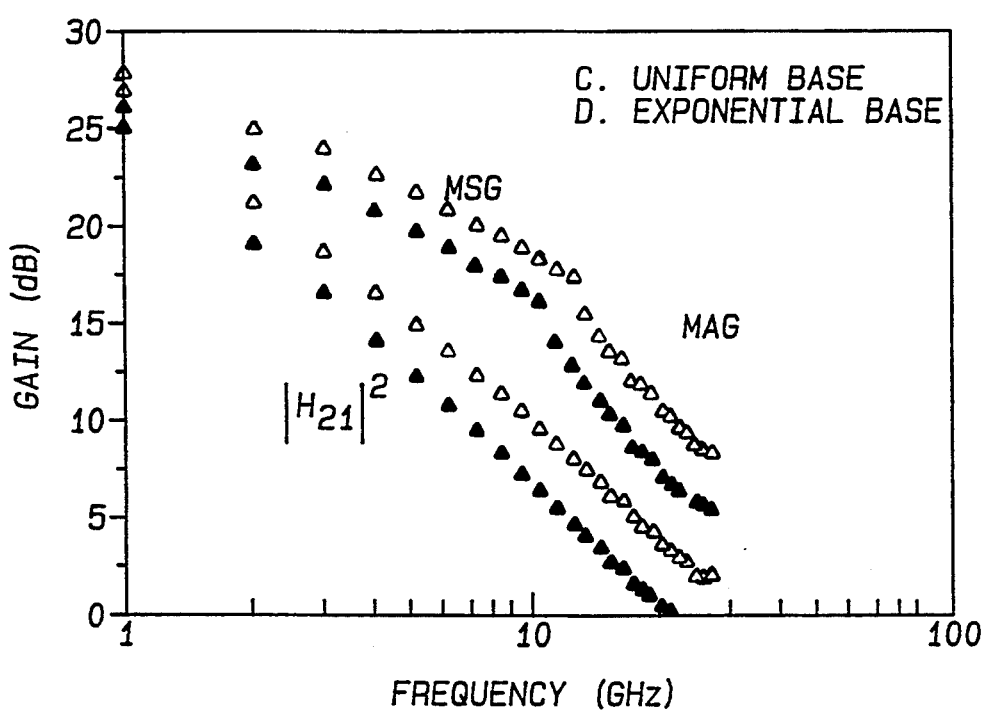
FIG. 5 is a table comparing characteristics of heterojunction bipolar transistors uniform base doping, graded composition, and graded doping in accordance with the present invention.
FIG. 6 is a graph comparing the frequency of response of uniformly doped and exponentially graded base heterojunction bipolar transistors in accordance with the present invention from on-wafer S-parameter measurements.

Referring now to FIG. 6, there is shown a comparison of the frequency response of graded versus uniformly doped wafers C and D. Average β on the uniformly doped wafers is 60 to 65, while average β for the exponentially doped wafers is 70 to 135. It appears that the increase in β is due to reduced surface and bulk recombination associated with the built-in field, in a manner similar to graded composition HBTs.

FIG. 5 is a comparison of improvements in device performance for exponential graded doping devices with uniform base and a graded composition structure. The bade transit time $t_B$ is reduced from 2.2 pS for the baseline profile to 0.88 pS for the graded doping and 0.65 pS for the graded composition structures. The resulting improvements in $f_T$ are considerable. $f_T$ increases from 22.6 GHz for the baseline HBT to 27.8 GHz for the graded doping profile and 29.0 GHz for the graded composition profile. In addition, the reduced base resistance of the graded doping profile, due to the increased Gummel number, yields an increase in $f_{max}$ to 54.6 GHz. $f_{max}$ for the graded composition device was not substantially increased even with the improvement in $f_T$ due to slightly higher base resistance. The device results quoted here were obtained on devices grown and processed in series. Slight variations in the device growth and processing schedule can explain the variations in these results. For further details of this composition study, see D. C. Streit et al., "High Performance HBTs With Built-In Base Fields: Exponential Graded Doping vs. Graded Composition," proceedings of the IEEE Cornell conference on Advanced Concepts in High Speed Semiconducting Devices and Circuits, pp. 325-333, 1991. The base resistance of the structures with exponentially graded base doping is reduced by about 40% compared to the structures with uniform base doping the high base doping at the emitter edge helps to reduce contact resistance, and the higher Gummel number helps to reduce the base sheet resistance. Reductions in base resistance for the same base thickness are normally accompanied by reductions in β, because of increased recombination associated with higher doping. For the case of exponentially graded doping, high β and low $R_b$ can coexist.

Bandgap narrowing in heavily doped p-type GaAs is significant, and produces a built-in field that opposes that generated by the dopant concentration gradient in the drift profile. Using optical techniques the room-temperature bandgap in our Be-doped GaAs were measured. The bandgap narrowing from $g \times 10^{18}$ to $5 \times 10^{19} cm^{-3}$ is found to be 0.023 eV. This is less than the 0.032 eV predicted by others from optical measurements up to $1 \times 10^{19} cm^{-3}$, and is considerably less than 0.097 eV inferred from electrical measurements. Bandgap shrinkage of more than 2.3 kT would negate any benefit due to graded doping, and we would not expect to see enhanced HBT performance. The built-in field due to the exponential-doping gradient, assuming constant $E_g$ across the base, is $$E = -\frac{d\psi}{dx} = -\frac{kT}{q}\frac{1}{N(x)}\frac{dN(x)}{dx} = \frac{1}{L}\frac{kT}{q}.$$

For L=608 Å the built-in field is E=4.25 kV/cm. We estimate that this value is reduced to about 2.6 kV/cm due to the dependence of $E_g$ on doping.

Figure 7:
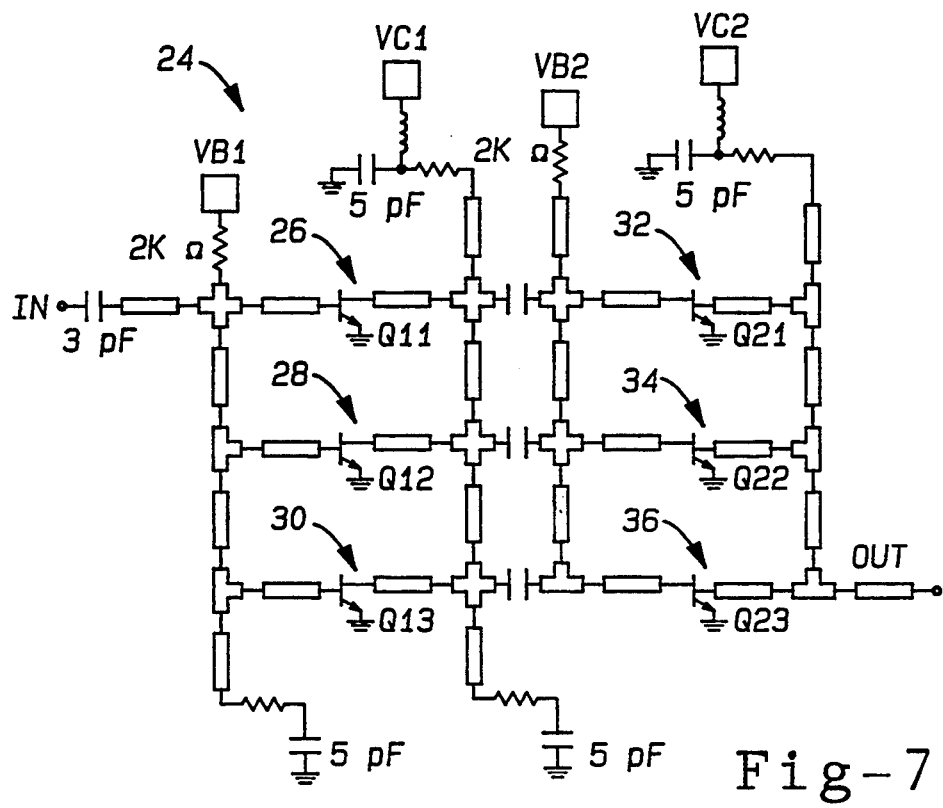
FIG. 7 is a schematic diagram of a matrix HBT distributed amplifier using exponentially graded base devices.
Figure 8:
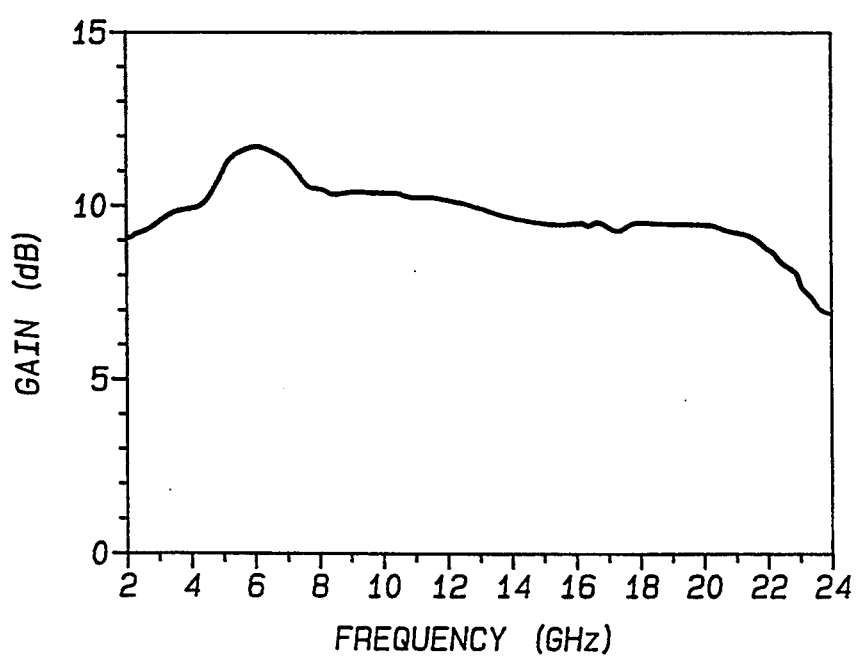
FIG. 8 is a graph of the frequency response of a matrix HBT distributed amplifier using exponentially graded base devices.

The exponentially-graded device profile was used in the fabrication of a wideband distributed matrix amplifier shown in FIGS. 7 and 8. The amplifier 24, shown in FIG. 7, uses six HBTs 26-36 produced in accordance with the present invention. A plot of gain vs. frequency is shown in FIG. 8. In addition to the expected performance improvements due to increased $f_T$ and $f_{max}$, the input capacitance of the amplifier was reduced by −30% due to the reduction in $T_B$, further enhancing the performance of the amplifier. The bandwidth was nearly doubled to 24 GHz compared to similar amplifiers fabricated using the baseline 1400 Å $1\times10^{19}$cm$^{-3}$ profile.

From the foregoing it can be seen that the use of exponentially graded doping in the base of GaAs/AlGaAs HBTs has several useful consequences. Compared to uniformly doped devices, $f_T$ is increased by 35 to 40% due to reduced base transit time, $f_{max}$ is increased by about 45% due to higher $f_T$ and reduced base resistance, β is increased due to the built-in field, and the breakdown voltage is increased slightly. Bandgap narrowing reduces, but does not negate, the built-in field associated the with base doping gradient. Even higher Be concentrations can be utilized, and $1\times10^{20}$cm$^{-3}$ has been achieved. Also, the teachings of the present invention can be employed to produce npn or pnp transistors. Various grading profiles besides exponential may also be utilized such as linear or non-linear exponential profiles. Those skilled in the art can appreciate that other advantages can be obtained from the use of this invention and that modification may be made without departing from the true spirit of the invention after studying this specification, drawings, and following claims.

What is claimed is:

1. A heterojunction bipolar npn transistor comprising:
   a substrate;
   a collector layer formed on said substrate;
   a base layer formed on said collector, said layer containing a p-type dopant with a graded base concentration which varies according to a predetermined profile from a maximum value at the top of the base layer to a minimum value at the bottom of the base layer, and wherein the graded dopant concentration varies exponentially; and
   an emitter layer formed on top of said base layer.

2. A heterojunction bipolar npn transistor comprising:
   a substrate;
   a collector layer formed on said substrate;
   a base layer formed on said collector, said base layer containing a p-type dopant with a graded concentration which varies according to a predetermined concentration which varies according to a predetermined profile from a maximum value at the top of the base layer to a minimum value at the bottom of the base layer, and wherein said base dopant concentration N(x) varies as a function of position (x) according to the expression:

$$N(x) = N_0 e^{-X/L}$$

where $N_0$ equals the dopant concentration at the top of the base, L=608 Å, and x is defined as zero at the top of the base; and
   an emitter layer formed on and top of said base layer.

3. An npn heterojunction bipolar transistor comprising:
   a GaAs substrate;
   a GaAs collector formed on said substrate;
   a GaAs base layer formed on said collector, said base layer including a p-type dopant which is exponentially graded in concentration from a maximum value at the top of the base layer to a minimum value at the bottom of the base layer; and
   an AlGaAs emitter layer formed on top of said base layer.

4. The npn transistor of claim 3 wherein said dopant is Beryllium which has a composition of about $5\times10^{19}$ cm$^{-3}$ at the top of the base layer and about $5\times10^{18}$ cm$^{-3}$ at the bottom of the base layer.

5. The npn transistor of claim 3 wherein said collector further comprises a subcollector layer formed on said substrate and a collector layer formed on said subcollector layer, said collector formed on said subcollector layer being about 1.0 μm thick.

* * * * *

UNITED STATES PATENT AND TRADEMARK OFFICE
CERTIFICATE OF CORRECTION

PATENT NO. : 5,448,087
DATED     : September 5, 1995
INVENTOR(S) : Dwight C. Streit; Aaron K. Oki It is certified that error appears in the above-indentified patent and that said Letters Patent is hereby corrected as shown below:

On title page, item
[75] Dwight C. Streit

Signed and Sealed this

Second Day of January, 1996

Attest:

BRUCE LEHMAN

*Attesting Officer*     *Commissioner of Patents and Trademarks*